United States Patent [19]

Feldbrugge

[11] Patent Number: 4,993,051
[45] Date of Patent: Feb. 12, 1991

[54] JOHNSON COUNTER CIRCUIT WITH INVALID COUNTER POSITION DETECTION AND CORRECTION MECHANISM

[75] Inventor: Fredericus H. J. Feldbrugge, Beekbergen, Netherlands

[73] Assignee: U.S. Philips Corporation, New York, N.Y.

[21] Appl. No.: 308,695

[22] Filed: Feb. 8, 1989

[30] Foreign Application Priority Data

Feb. 17, 1988 [NL] Netherlands .......................... 8800390

[51] Int. Cl.$^5$ ...................... H03K 27/00; H03K 21/40
[52] U.S. Cl. ......................................... 377/28; 377/34; 377/56
[58] Field of Search ......................... 377/28, 34, 55, 56

[56] References Cited

U.S. PATENT DOCUMENTS

| | | | |
|---|---|---|---|
| 3,530,284 | 9/1970 | Wood | 377/28 |
| 3,555,249 | 1/1971 | Altrons | 377/34 |
| 3,909,729 | 9/1975 | Fry | 377/56 |
| 4,493,095 | 1/1985 | Yazawa | 377/107 |
| 4,568,841 | 2/1986 | Mayhew | 377/107 |
| 4,839,909 | 6/1989 | Warner | 377/34 |

OTHER PUBLICATIONS

K. S. Hall, "Modified Twisted-Ring Counter Circuit", IEEE Transactions on Computers, Jun. 1969, p. 568.
C. vanHolten, "Digital Dividers With Symmetrical Outputs", Wireless World, vol. 88, No. 1559, Aug. 1982, pp. 43-46.
G. L. Douglas, "Walking Counter Synchronization Scheme", IBM Technical Disclosure Bulletin, vol. 15, No. 6, Nov. 1972, pp. 1848, 1949.
P. M. Overfield, "Error Correction in Johnson Counters", New Electronics, vol. 13, No. 11, May 27, 1980, p. 38.

Primary Examiner—John S. Heyman
Attorney, Agent, or Firm—Jack D. Slobod

[57] ABSTRACT

An end-around coupled chain of n bit counter stages, including an inversion element in the chain, employs a detection/correction mechanism for an invalid counter position. A "1,0" state pair is detected in the highest order two bit stages and the simultaneous occurrence of any "1" state in an adjacent group of at least J stages (where J equals the integer part of the number of stages divided by three) indicates an invalid counter position. At least said adjacent group of bit stages is set to "0" in response to the detection of an invalid counter position.

21 Claims, 4 Drawing Sheets

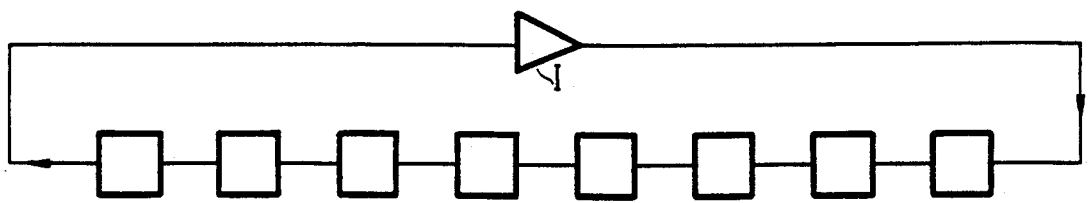
FIG. 1
| | | | | | | | | | | | | | | | | |
|---|---|---|---|---|---|---|---|---|---|---|---|---|---|---|---|---|
|1)|0|0|0|0|0|0|0| |9)|1|1|1|1|1|1|1|
|2)|0|0|0|0|0|0|1| |10)|1|1|1|1|1|1|0|
|3)|0|0|0|0|0|1|1| |11)|1|1|1|1|1|0|0|
|4)|0|0|0|0|1|1|1| |12)|1|1|1|1|0|0|0|
|5)|0|0|0|1|1|1|1| |13)|1|1|1|0|0|0|0|
|6)|0|0|1|1|1|1|1| |14)|1|1|0|0|0|0|0|
|7)|0|1|1|1|1|1|1| |15)|1|0|0|0|0|0|0|
|8)|0|1|1|1|1|1|1| |16)|1|0|0|0|0|0|0|
FIG. 2
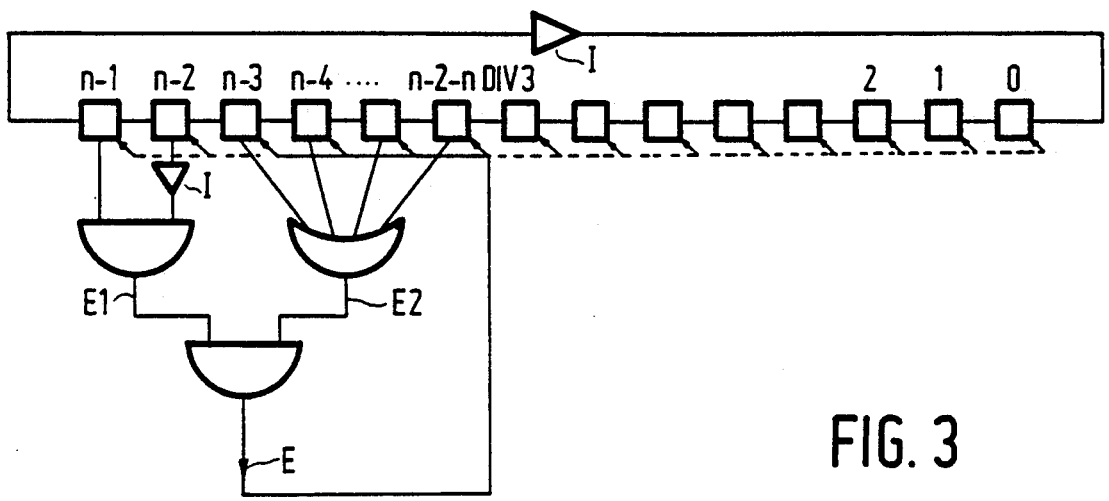
FIG. 3
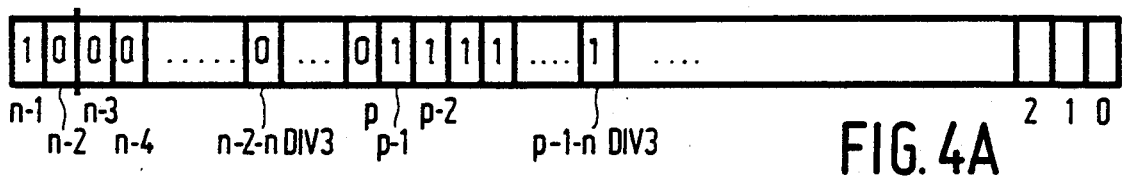
FIG. 4A
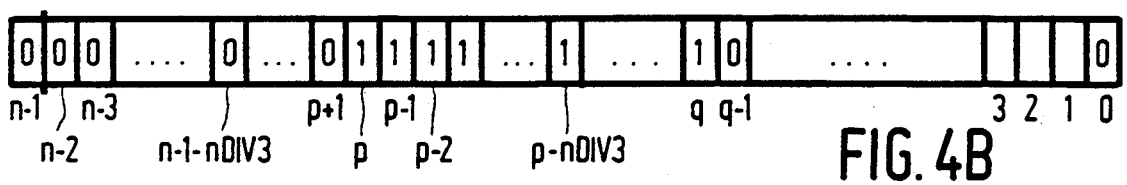
FIG. 4B

| | | | |
|---|---|---|---|
| n=3: | xx1 | | |
| n=4: | xx01 | | |
| | xx10 | | |
| n=5: | xx001 | | |
| | xx100 | | |
| n=6: | xx0010 | n=11: | xx000000100 |
| | xx0100 | | xx001000000 |
| n=7: | xx00011 | n=12: | xx0000001001 |
| | xx00101 | | xx0000001010 |
| | xx00110 | | xx0000001100 |
| | xx01001 | | xx0000010010 |
| | xx01100 | | xx0000010100 |
| | xx10010 | | xx0000011000 |
| | xx10100 | | xx0000100010 |
| | xx11000 | | xx0000100100 |
| | | | xx0000101000 |
| n=8: | xx000010 | | xx0001000001 |
| | xx000100 | | xx0001000010 |
| | xx001000 | | xx0001000100 |
| | xx010000 | | xx0001010000 |
| | | | xx0001100000 |
| n=9: | xx0000100 | | xx0010001000 |
| | xx0010000 | | xx0010010000 |
| | | | xx0010100000 |
| n=10: | xx00000101 | | xx0011000000 |
| | xx00000110 | | xx0100001000 |
| | xx00001010 | | xx0100010000 |
| | xx00001100 | | xx0100100000 |
| | xx00010010 | | xx0101000000 |
| | xx00010100 | | xx1000001000 |
| | xx00100001 | | xx1001000000 |
| | xx00100010 | | |
| | xx00101000 | | |
| | xx00110000 | | |
| | xx01000100 | n=13: | xx00000010000 |
| | xx01001000 | | xx00001000000 |
| | xx01010000 | | |
| | xx01100000 | | |
| | xx10000100 | | |
| | xx10100000 | | |

| | | | |
|---|---|---|---|
| 3 | 2, 1 | 0 | xx1 |
| 4 | 3, 2 | 1 | xx10 |
| 5 | 4, 3 | 2 | xx100 |
| 6 | 5, 4 | 2 | xx0100 |
| 7 | 6, 5 | 4, 3 | xx11000 |
| 8 | 7, 6 | 4 | xx010000 |
| 9 | 8, 7 | 4 | xx0010000 |
| 10 | 9, 8 | 7, 5 | xx10100000 |
| 11 | 10, 9 | 6 | xx001000000 |
| 12 | 11, 10 | 9, 6 | xx1001000000 |
| 13 | 12, 11 | 6 | xx00001000000 |
| 14 | 13, 12 | 10, 8 | xx010100000000 |
| 15 | 14, 13 | 11, 8 | xx0100100000000 |
| 16 | 15, 14 | 12, 9 | xx01001000000000 |
| 17 | 16, 15 | 13, 10 | xx010010000000000 |
| 18 | 17, 16 | 14, 10 | xx0100010000000000 |
| 19 | 18, 17 | 12, 11 | xx00001100000000000 |
| 20 | 19, 18 | 16, 12 | xx010001000000000000 |
| 21 | 20, 19 | 16, 12 | xx0010001000000000000 |
| 22 | 21, 20 | 17, 13 | xx00100010000000000000 |
| 23 | 22, 21 | 18, 14 | xx001000100000000000000 |
| 24 | 23, 22 | 19, 14 | xx0010000100000000000000 |
| 25 | 24, 23 | 20, 15 | xx00100001000000000000000 |
| 26 | 25, 24 | 21, 16 | xx001000010000000000000000 |
| 27 | 26, 25 | 22, 16 | xx0010000010000000000000000 |
| 28 | 27, 26 | 22, 17 | xx00010000100000000000000000 |
| 29 | 28, 27 | 23, 18 | xx001000001000000000000000000 |
| 30 | 29, 28 | 24, 18 | xx0001000001000000000000000000 |
| 31 | 30, 29 | 24, 18 | xx00001000001000000000000000000 |
| 32 | 31, 30 | 26, 20 | xx000100000100000000000000000000 |

JOHNSON COUNTER CIRCUIT WITH INVALID COUNTER POSITION DETECTION AND CORRECTION MECHANISM

BACKGROUND OF THE INVENTION

The invention relates to a counter circuit, comprising an end-around coupled chain of n bit stages, an inversion element which is included in the chain in order to form a counter having 2n valid counter positions, and a correction mechanism for forming a valid counter position from an invalid counter position. A counter circuit of this kind is also known as a Johnson counter with error correction; see the article "Error correction in Johnson counters" by P.M.Overfield in New Electronics, Vol. 13, No 11, 27/5/1980, p 38. The n bit stages of a Johnson counter (without error correction) are qenerally connected in series and coupled end-around via an inversion element. External events or a clock signal which is synchronous or not, determine when the counter changes over from one counter position to the next. Starting from a valid initial counter position in which, for example all bit stages have the value zero, the counter successively assumes all 2n valid counter positions before returning to the initial counter position again. These valid counter positions are characterized in that at the most one 1—0 or 0—1 transition occurs between two successive bit stages, ignoring a transition, if any, at the inversion element. When an invalid counter position occurs in the counter, for example due to a power failure, a valid counter position can never be reached again in the absence of a correction mechanism. Therefore, Overfield has extended the Johnson counter with a correction mechanism which also takes into account the end-around coupling via the inversion element. Within 2n counter position transitions, this correction mechanism corrects an invalid counter position so that a valid counter position is obtained.

It is a drawback of this Johnson counter with correction mechanism that any invalid counter position occurring is corrected but not detected; it does not involve a separate signal which occurs exclusively in the case of an invalid counter position and for an arbitrary value of n such a signal cannot be simply derived either from the circuit. The detection of invalid counter positions is very useful in view of the correction of errors stemming from the occurrence of invalid counter positions.

SUMMARY OF THE INVENTION

It is an object of the invention to provide a counter circuit which detects all invalid counter positions within a limited number of counter position transitions with evaluation of a small number of bit stages, so that the described drawback is mitigated.

To achieve this, in accordance with the invention the correction mechanism comprises the following components when n is an arbitrary natural number not equal to 8:

- a first logic sub-circuit which is fed by a first group comprising two successive bit stages for detecting antivalent values in these bit stages;
- a second logic sub-circuit which is fed by a second group comprising less than n-2 other bit stages, for detecting a contradiction with respect to the current values of said two successive bit stages;
- a combination stage which is fed by the first and the second logic subcircuit in order to detect coincidence and to form, in response thereto, a detection signal for an invalid counter position.

Even though such a mechanism is described for n=8 in the article "Digital dividers with symmetrical output" by C. Van Holten, Wireless World, Vol. 88, No. 1559, Aug. 1982, pp. 43-46, it is not disclosed therein how such a mechanism could be realised for other values of n. Moreover, the circuit given for n=8 is not minimal: in accordance with the invention for the detection and correction it suffices to check fewer bit stages than given by Van Holten.

An embodiment in accordance with the invention is characterized in that said detection signal is applied as a reset signal to the bit stages which do not form part of said first group. In this counter circuit an invalid counter position is detected within 2n counter position transitions after its appearance, after which it is immediately corrected in parallel.

The invention also relates to a circuit comprising such a counter circuit.

BRIEF DESCRIPTION OF THE FIGURES

The invention will be described in detail hereinafter with reference to the following Figures:

FIG. 1 shows the principle of the Johnson counter;

FIG. 2 shows a table containing the valid counter positions of a Johnson counter comprising 8 bit stages;

FIG. 3 shows a Johnson counter comprising a detection mechanism.

FIGS. 4A and 4B show two invalid counter positions succeeding one another in time;

Figures 5C, 5D:
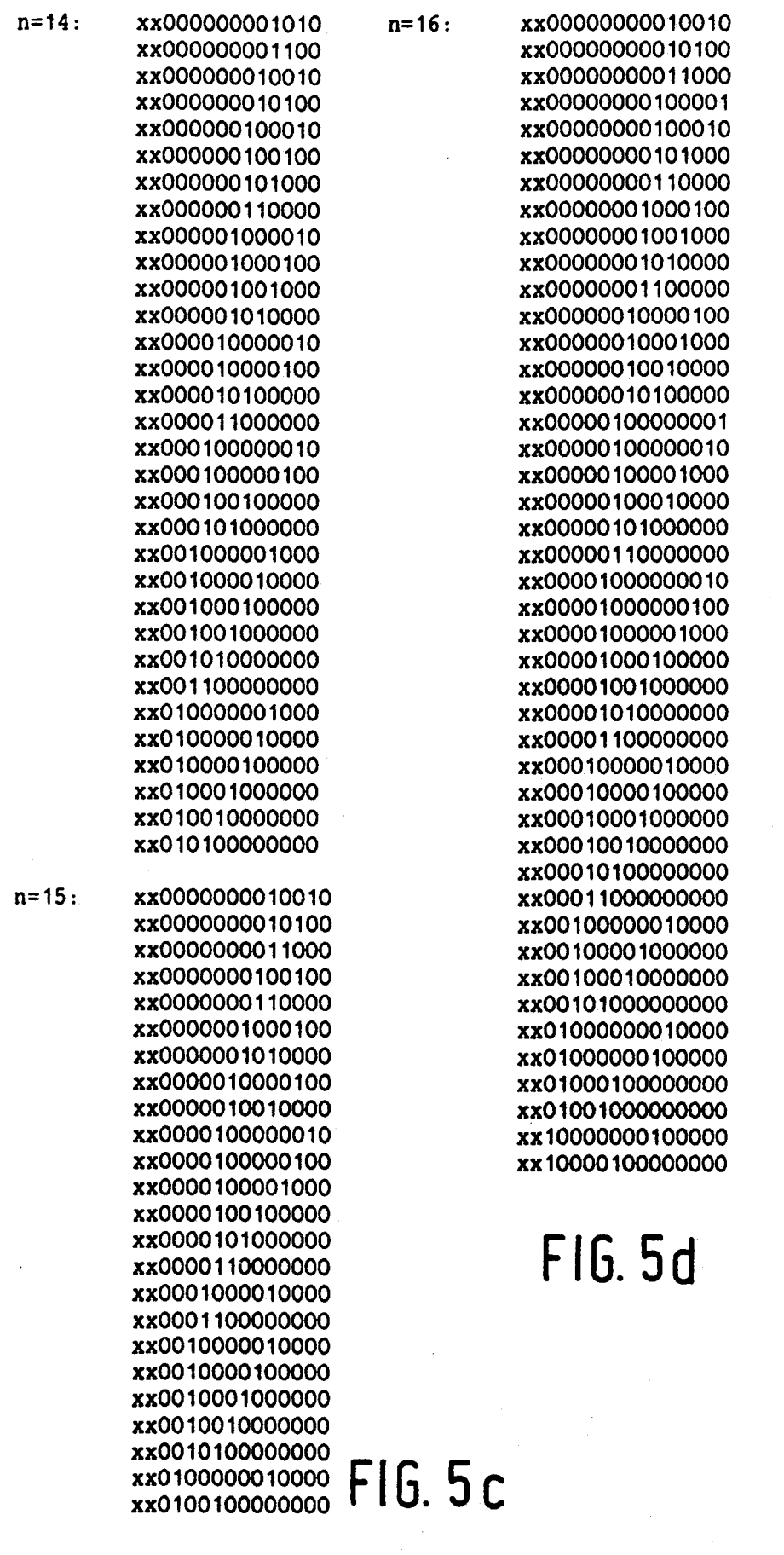

FIGS. 5A to 5E show tables containing suitable locations for the second logic sub-circuit; FIGS. 5A to 5D show all minimum detection circuits for $n < = 16$; FIG. 5E shows examples of minimum detection circuits for $n < = 32$;

FIG. 6 shows a circuit comprising such a counter circuit.

Figures 5E, 6:
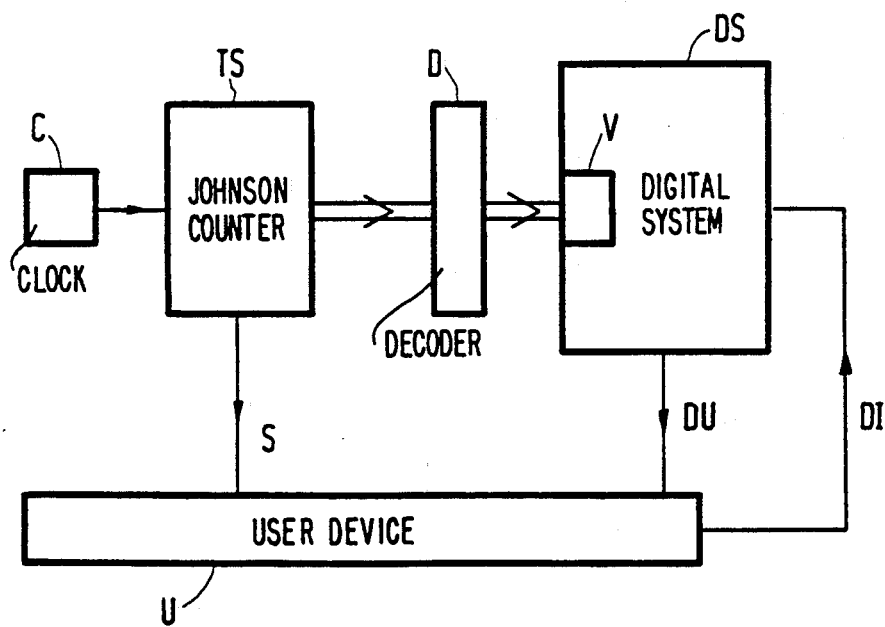

DESCRIPTION OF A PREFERRED EMBODIMENT.

The general construction of a Johnson counter is as shown in FIG. 1: a shift register in which n bit stages (flip-flops) are connected in series, the last bit stage being coupled to the first bit stage via an inversion element I. In the Figure the value n=8 is chosen by way of example. From the valid initial counter position in which all bit stages have the value zero, the counter successively assumes a series of 2n valid counter positions which are shown in FIG. 2 in the form of a table for n=8. A clock signal, synchronous or not, or external events determine when the counter changes over from one counter position to the next; such a transition is also referred to as a step. The decoding of the valid counter positions is simple in the Johnson counter: they are characterized by the fact that in the entire counter at the most one 1—0 or 0—1 transition may occur for two successive bit stages, not taking into account a transition if any, at the inversion element. All counter positions which do not occur in FIG. 2 are invalid for the counter comprising 8 bit stages.

An n-bit shift register comprising an odd number of inversion elements larger than one is equivalent thereto. This can be simply understood by removing successive inversion element two-by-two and by inverting the values of any intermediate bit stages until one inversion element remains. The attractive property that valid counter positions can be simply decoded, however, is lost in a counter comprising an odd number of inversion elements larger than one. An n-bit shift register comprising an even number of inversion elements does not have 2n valid counter positions which can be simply decoded and will be ignored hereinafter. Therefore, it will be assumed that there is one inversion element.

The Overfield correction mechanism ensures that any invalid counter positions are corrected within 2n steps so that valid counter positions are obtained. However, no detection takes place. Should consequences of invalid counter positions have to be remedied, it is important to know that such an invalid counter position has occurred. To this end, a logic circuit is added to the counter. A first logic sub-circuit, fed by two permanently selected successive bit stages, checks whether antivalent values apply for the relevant two bit stages. The values of two successive bit stages are antivalent when they are either unequal and not separated by the inversion element, or are equal and separated by the inversion element. A second logic sub-circuit checks whether a contradiction with respect to the values of the two bit stages of the first logic sub-circuit follows from the current values of a number of other bit stages, i.e. whether the combination of all these values implies an invalid counter position. Obviously, the second logic sub-circuit could be fed with all n-2 other bit stages. This is because, when the first logic sub-circuit signals a 1—0 transition, all bit stages between said 0 and the inversion element must also have the value 0 and the other bit stages must have the value 1; when the first logic sub-circuit signals the values 0-0 on both sides of the inversion element, all other bit stages must also have the value 0, etc. In accordance with the invention, however, all invalid counter positions can be detected within 2n steps by means of a smaller, second logic subcircuit. FIG. 3 shows a circuit which detects an invalid counter position within 2n steps. The following will demonstrate that this is indeed the case.

Consider a Johnson counter comprising n bit stages. Number the bit stages from right to left as 0 to n-1, after which the inversion element closes the chain. Denote the current value of the $i^{th}$ bit stage as $c(i)$ for $0 <= i <= n-1$. Define the following logic expressions:
E1:=c(n−1) AND NOT(c(n−2));
E2:=c(n−3) OR c(n−4) . . . OR c(n−2−(n DIV 3));
E:=E1 AND E2.

Therein, "DIV" is the integer division: n DIV 3 equals n divided by 3, rounded down to an integer number.

Expression E1 is formed by the first logic sub-circuit which checks whether a 1—0 transition occurs at the bit stages n−1 and n−2. Expression E2 is formed by the second logic sub-circuit and becomes TRUE if at least one of the (n DIV 3) bit stages numbered n−3 to n−2−(n DIV 3) has the value 1. Expression E combines the values of E1 and E2, thus forming a detection signal for invalid counter positions; see FIG. 3 in which the nomenclature is self evident. It will be apparent that an invalid counter position is concerned when the expression E is TRUE.

Theorem: in an n bit Johnson counter the expression E becomes TRUE within 2n steps when an invalid counter position occurs.

Proof: an invalid counter position is characterized by at least two transitions (1—0 or 0—1). Assume that the first transition occurs at the bits n−1, n−2 and that the bit n−1 has the value 1 and the bit n−2 has the value 0 (in the opposite case, this will be so n steps further). If E is FALSE, therefore: $c(n-3) = c(n-4) = \ldots = c(n-2-(n \text{ DIV } 3)) = 0$. Assume that the second transition (0—1) occurs at the bits p, p−1, for which $0 < p <= n-2-(n \text{ DIV } 3)$, see FIG. 4A. In that case the invalid counter position is detected after 2n−(p+1) steps (E becomes TRUE) unless: $c(p-2) = \ldots = c(p-1-(n \text{ DIV } 3)) = 1$; because c(n−1)=1, p−1−(n DIV 3)>=0, so that (n DIV 3)<p<=n−2−(n DIV 3). After one step, c(0)=0, so a 1—0 transition must be present at the bits q, q−1 for some q where 0<q<=p−(n DIV 3), see FIG. 4B. The invalid counter position is then detected after n−(q+1) steps, (E becomes TRUE), unless $c(q-2) = \ldots = c-(q-1-(n \text{ DIV } 3)) = 0$. Because c(n−1) is also 0, and c(q−1−(n Div 3))=0, it must also hold good that q−1−(n DIV 3)>=0 because otherwise the inversion element would have been passed. In conjunction with the inequalities q<=p−(n DIV 3) and p<=n−2−(n DIV 3) already derived it follows therefrom that (n DIV 3)+1<=q<=n−2−2*(n DIV 3), so 3*(n DIV 3)<=n−3. This is a contradiction. Therefore the invalid counter position will certainly be discovered because the expression E becomes TRUE. In view of this fact, it is trivial that the discovery occurs within 2n steps: the n-bit Johnson counter repeats itself after 2n steps and hence also E. QED.

The logic sub-circuits forming the expressions can be shifted together; in the case of a shift across the inversion element, the relevant values must be inverted. Alternatively, the entire circuit can be mirrored and the values c(i) can be inverted. Functionally this produces equivalence for the circuit as well as for the proof.

Thus, using a circuit as described above, all invalid counter positions can be detected. When the (n DIV 3) bit stages feeding the second logic sub-circuit are not consecutive to the two bit stages feeding the first logic sub-circuit, it may occur that not all invalid counter positions are detected. For example, for n=5 the invalid counter position 10101 may arise; one step later the counter position becomes 01010, subsequently 10101 again, etc. When the first group consists of the two extreme left hand bit stages as in the above case, and the second group consists of the fourth bit stage from the left, the invalid counter position will never be detected. When the second group consists of the extreme right hand bit stage, all invalid counter positions will be detected: 10..x becomes 0..x0, subsequently ..x01, and this is 10x..mirrored.

When the detection signal is applied as a set signal to the reset input of all n−2 bit stages which do not form part of the first group, the counter position is immediately corrected in parallel so as to obtain the valid counter position 100...00. It sometimes suffices to reset only the second group. For example, when n=4, and the first group is formed by the two extreme left hand bit stages and the second group by the extreme right hand bit stage, the counter position 1001 is then immediately corrected to 1000, and the counter position 1011 successively becomes 1010 (correction), 0100, 1001 (detection) and 1000 (correction). In that case correction is not performed immediately, but after a few steps.

It has been found that detection can often be realised by means of an even smaller circuit. Generally the detection will require a few more steps when a smaller second logic sub-circuit is used; on average a larger second logic sub-circuit will "discover" invalid counter positions sooner. Because the counter repeats itself after 2n steps, detection will in any case take place within 2n steps. Computer simulations for small values of n (n < =32) have offered the following results (see FIG. 5): starting from the first logic sub-circuit, forming the expression E1 as above, FIGS. 5A to 5D show tables containing for n< =16 all minimal sub-sets of the collection of bit stages which are suitable for feeding the second logic sub-circuit in such a manner that all invalid counter positions are detected. The two crosses denote the bits feeding the first logic sub-circuit. This circuit checks whether there is a 1—0 transition. The ones denote a minimal combination of bits which is suitable for feeding the second logic sub-circuit. The other bits are represented by zeros. FIG. 5E shows a table containing for each n< =32 an example of a minimum sub-set suitable for feeding the second logic sub-circuit. The first column states the value of n. The second column states the positions of the bits feeding the first logic subcircuit, the numbering of the bits in the counter being from right to left, starting at 0. The third column states the positions of the bits feeding the second logic sub-circuit. The two crosses in the fourth column denote the bits feeding the first logic sub-circuit, the ones denote a minimal combination of bits suitable for feeding the second logic sub-circuit; the other bits are denoted by zeros. For n=3, 4, 5, 6, 8, 9, 11 and 13 a single bit stage suffices for the detection of all invalid counter positions; for the other values of n for which simulations have been performed two bit stages suffice. For larger values of n no simulation has yet been performed; for the second logic sub-circuit the already discussed (n DIV 3) bit stages can be used. It is to be noted that no invalid counter positions exist for n<3. It is also to be noted that for n=8 a second logic sub-circuit is given which is smaller than that described in the article by Van Holten.

Finally, FIG. 6 shows an application of such a counter circuit in a circuit. Clock C is connected to a counter circuit TS which comprises a Johnson counter with a logic circuit for correction and detection. User device U feeds input data DI to and receives output data DU from a digital system DS. Decoder D is fed by TS and controls an element V in DS (for example a processing element). In the case of an invalid counter position, TS applies a detection signal S to U. The clock C, the counter circuit TS, the decoder D and the element V form a sequencer controlling the sequence of operations in the digital system DS.

I claim:

1. A Johnson counter circuit comprising an end-around coupled shift register chain of n bit stages, an inversion element which is included in the chain in order to form a counter having 2n valid counter positions, and a correction mechanism for forming a valid counter position from an invalid counter position, characterized in that, when n is an arbitrary natural number not equal to 8 and more than four, the correction mechanism comprises:

a first logic sub-circuit means, which is fed by a first group consisting of two successive bit stages, for detecting antivalent values in these two successive bit stages;

a second logic sub-circuit means, which is fed by a second group comprising more than one and less than n−2 other bit stages, for detecting when any bit stage of said second group has a value which, when said antivalent values are present in said two successive bit stages of said first group, indicates an invalid counter position; and a combination stage means, which is fed by the first and the second logic sub-circuit means, for detecting coincidence of detections by said first and second logic sub-circuit means and for forming, in response thereto, a detection signal for an invalid counter position which is applied as a set signal to at least all bit stages of said second group having said value.

2. A counter circuit as claimed in claim 1, characterized in that said detection signal is applied as a set signal to all n bit stages.

3. A counter circuit as claimed in claim 1, characterized in that said detection signal is applied as a set signal to only all n−2 bit stages which do not form part of said first group of bit stages.

4. A counter circuit as claimed in claim 1, characterized in that said detection signal is applied as a set signal to only all bit stages of said second group of bit stages.

5. A counter circuit as claimed in claim 1, characterized in that n is more than five and in that said second group of bit stages comprises (n DIV 3) successive bit stages.

6. A counter circuit as claimed in claim 5, characterized in that said (n DIV 3) successive bit stages of said second group are consecutive to said two successive bit stages of said first group.

7. A counter circuit as claimed in claim 1, in which the number of bit stages n is < =32, characterized in that said second group of bit stages comprises only two bit stages.

8. A circuit comprising a counter circuit as claimed in claim 1, a decoder which is fed thereby, and a further element which is controlled by said decoder.

9. A counter circuit as claimed in claim 5, characterized in that said detection signal is applied as a set signal to all n bit stages.

10. A counter circuit as claimed in claim 5, characterized in that said detection signal is applied as a set signal to all n bit stages.

11. A counter circuit as claimed in claim 5, characterized in that said detection signal is applied as a set signal to only all n−2 bit stages which do not form part of said first group of bit stages.

12. A counter circuit as claimed in claim 6, characterized in that said detection signal is applied as a set signal to only all n−2 bit stages which do not form part of said first group of bit stages.

13. A counter circuit as claimed in claim 5, characterized in that said detection signal is applied as a set signal to only all bit stages of said second group of bit stages.

14. A counter circuit as claimed in claim 6, characterized in that said detection signal is applied as a set signal to all bit stages of said second group of bit stages.

15. A Johnson counter circuit comprising an end-around coupled shift register chain of n bit stages, an inversion element which is included in the chain in order to form a counter having 2n valid counter positions, and a detection/correction mechanism for forming a valid counter position from an invalid counter position, characterized in that the detection/correction mechanism is fed only by less than 2+(n DIV 3) bit stages of said chain which are not all successive to each other.

16. A counter as claimed in claim 15, wherein n=6,8,9, 11, or 13 and said bit stages feeding said detection/correction mechanism are only three in number.

17. A method of correcting an invalid Johnson counter position in an end-around shift register chain of n not equal to 8 and $>=5$ bit stages, with an inversion element in the chain so that there are 2n valid counter positions, comprising the following steps:

first detecting antivalent states in a first group of two successive bit stages;

second detecting when a state occurs in any of a second group of more than one and less than n−2 other bit stages, which when said antivalent states are also present in said first group of bit stages, indicates an invalid counter position;

third detecting coincidence of said first and second detections; and setting bit stages of said counter in response to said third detecting.

18. The method of claim 17 where said setting step is of only all bit stages of said second group.

19. The method of claim 17 where said setting step is of only all bit stages other than those in said first group.

20. The method of claim 17 wherein said second group of bit stages comprises at least (n DIV 3) successive bit stages.

21. The method of claim 18 wherein said second group of bit stages comprises at least (n DIV 3) successive bit stages consecutive to said two bit stages of said first group.

* * * * *